(12) United States Patent
Wagle et al.

(10) Patent No.: US 12,495,491 B2
(45) Date of Patent: Dec. 9, 2025

(54) PROCESS FOR PRODUCING A METAL-CERAMIC SUBSTRATE, AND A METAL-CERAMIC SUBSTRATE PRODUCED USING SUCH METHOD

(71) Applicant: Rogers Germany GmbH, Eschenbach (DE)

(72) Inventors: Fabian Wagle, Bayreuth (DE); Tilo Welker, Neuhaus (DE); Andreas Meyer, Speichersdorf (DE); Karsten Schmidt, Eschenbach (DE)

(73) Assignee: ROGERS GERMANY GMBH, Eschenbach (DE)

( * ) Notice: Subject to any disclaimer, the term of this patent is extended or adjusted under 35 U.S.C. 154(b) by 273 days.

(21) Appl. No.: 17/921,221

(22) PCT Filed: Mar. 24, 2021

(86) PCT No.: PCT/EP2021/052470
§ 371 (c)(1),
(2) Date: Oct. 25, 2022

(87) PCT Pub. No.: WO2021/219260
PCT Pub. Date: Nov. 4, 2021

(65) Prior Publication Data
US 2023/0164913 A1 May 25, 2023

(30) Foreign Application Priority Data
Apr. 29, 2020 (DE) .................... 10 2020 111 698.5

(51) Int. Cl.
*B23K 1/00* (2006.01)
*C04B 35/645* (2006.01)
(Continued)

(52) U.S. Cl.
CPC ............ *H05K 1/0306* (2013.01); *B23K 1/00* (2013.01); *C04B 35/6455* (2013.01);
(Continued)

(58) Field of Classification Search
CPC .......... B23K 1/008; B23K 1/012; B23K 1/19; B23K 3/04; B23K 3/08
See application file for complete search history.

(56) References Cited

U.S. PATENT DOCUMENTS

| 4,611,745 A | 9/1986 | Nakahashi et al. |
| 4,763,828 A | 8/1988 | Fukaya et al. |

(Continued)

FOREIGN PATENT DOCUMENTS

| CN | 105900222 A | 8/2016 |
| CN | 110891733 A | 3/2020 |

(Continued)

OTHER PUBLICATIONS

EP0153618 computer English translation (Year: 2024).*
(Continued)

*Primary Examiner* — Erin B Saad
(74) *Attorney, Agent, or Firm* — CANTOR COLBURN LLP

(57) ABSTRACT

The invention relates to a process for producing a metal-ceramic substrate (1), comprising:
 providing a ceramic element (10) and a metal layer,
 providing a gas-tight container (25) that encloses the ceramic element (10), the container (25) preferably being formed from the metal layer or comprising the metal layer,
 forming the metal-ceramic substrate (1) by connecting the metal layer to the ceramic element (10) by means of hot isostatic pressing, wherein, for the purpose of forming the metal-ceramic substrate (1), an active metal layer
(Continued)

(15) or a contact layer comprising an active metal is arranged at least in some sections between the metal layer and the ceramic element (10) for supporting the connection of the metal layer to the ceramic element (10).

17 Claims, 2 Drawing Sheets

(51) Int. Cl.
*C04B 37/02* (2006.01)
*H05K 1/03* (2006.01)
*H05K 3/38* (2006.01)

(52) U.S. Cl.
CPC .......... *C04B 37/021* (2013.01); *C04B 37/026* (2013.01); *H05K 3/38* (2013.01); *C04B 2235/6581* (2013.01); *C04B 2237/407* (2013.01); *C04B 2237/706* (2013.01); *C04B 2237/708* (2013.01); *H05K 2201/0355* (2013.01)

(56) References Cited

U.S. PATENT DOCUMENTS

| | | | |
|---|---|---|---|
| 5,881,607 A * | 3/1999 | Ito | F16D 1/0858 |
| | | | 415/216.1 |
| 6,020,076 A | 2/2000 | Fujii et al. | |
| 10,351,477 B2 * | 7/2019 | Meyer | H01L 21/4857 |
| 11,338,397 B2 | 5/2022 | Britting et al. | |
| 2010/0032143 A1 | 2/2010 | Datta et al. | |
| 2016/0304405 A1 * | 10/2016 | Meyer | H01L 21/4857 |
| 2018/0213639 A1 * | 7/2018 | Meyer | C04B 37/026 |
| 2023/0164913 A1 * | 5/2023 | Wagle | C04B 35/6455 |
| | | | 174/256 |
| 2023/0286872 A1 * | 9/2023 | Wagle | C04B 35/6455 |

FOREIGN PATENT DOCUMENTS

| | | |
|---|---|---|
| DE | 2740332 A1 | 3/1978 |
| DE | 19927046 B4 | 1/2007 |
| DE | 102009033029 A1 | 1/2011 |
| DE | 102013104739 A1 | 9/2014 |
| DE | 102013113736 A1 | 6/2015 |
| DE | 102013113734 B4 | 3/2018 |
| JP | S6183694 A | 4/1986 |
| JP | S61222965 A | 10/1986 |
| JP | 62248595 A * | 10/1987 |
| JP | S-6471592 A | 3/1989 |
| JP | 2000117427 A | 4/2000 |
| JP | 4325470 B2 | 9/2009 |
| TW | 397808 B | 7/2000 |

OTHER PUBLICATIONS

Computer English Translation of JP-62248595-A (Year: 2025).*
Chemical Abstracts XP000154236, ISSN: 0009-2258.
International Preliminary Report on Patentability for PCT/EP2021/052470, International Filing Date Mar. 24, 2021, Date of Mailing Sep. 5, 2022, 12 pages.
International Search Report for PCT/EP2021/052470, International Filing Date Mar. 24, 2021, Date of Mailing Jun. 29, 2021, 14 pages.
Katsuaki Suganuma et al: "Effect of Interlayers in Ceramic-Metal Joints with Thermal Expansion Mismatches", Journal of the American Ceramic Society, Bd. 67, Nr. 12, Dec. 1, 1984 (Dec. 1, 1984), Seiten C-256, XP001351472.
International Preliminary Report on Patentability for PCT/EP2021/052470, International Filing Date Mar. 24, 2021, Date of Mailing Nov. 3, 2022, 6 pages.

* cited by examiner

PROCESS FOR PRODUCING A METAL-CERAMIC SUBSTRATE, AND A METAL-CERAMIC SUBSTRATE PRODUCED USING SUCH METHOD

CROSS-REFERENCE TO RELATED APPLICATIONS

This application is a National Stage filing of PCT/EP2021/052470, filed Mar. 24, 2021, which claims priority to DE 10 2020 111 698.5, filed Apr. 29, 2020, both of which are incorporated by reference in their entirety herein.

BACKGROUND

The present invention relates to a method for producing a metal-ceramic substrate and to a metal-ceramic substrate produced by such a method.

Metal-ceramic substrates are sufficiently known from the prior art, for example as printed circuit boards or circuit boards, for example from DE 10 2013 104 739 A1, DE 19 927 046 B4 and DE 10 2009 033 029 A1. Typically, connection areas for electrical components and conductor tracks are arranged on one component side of the metal-ceramic substrate, allowing interconnection of the electrical components and the conductor tracks to form electrical circuits. Essential components of the metal-ceramic substrates are an insulating layer, which is preferably made of a ceramic, and at least one metal sheet bonded to the insulating layer. Due to their comparatively high insulation strengths, insulation layers made of ceramics have proven to be particularly advantageous in power electronics. By structuring the metal layer, conductive tracks and/or connection areas for the electrical components can then be realized.

A requirement for providing such a metal-ceramic substrate is a permanent bond between the metal sheet and the ceramic layer. In addition to a so-called direct metal bonding method, i.e., a DCB or DAB method, it is known from prior art to bond the metal sheet to the ceramic layer using a solder material.

An active soldering method, e.g., for bonding metal layers or metal foils, in particular also copper layers or copper foils, to ceramic material, is understood to be a method which is specifically used for producing metal-ceramic substrates. In this method, a bond between a metal foil, for example a copper foil, and a ceramic substrate, for example an aluminum nitride ceramic, is produced at a temperature between about 650-1000° C. using a hard solder which, in addition to a main component such as copper, silver and/or gold, also contains an active metal. This active metal, which is for example at least one element selected from the group consisting of Hf, Ti, Zr, Nb, Ce, creates connection between the solder and the ceramic by chemical reaction, while the connection between the solder and the metal is a metallic hard solder connection.

Furthermore, from DE 10 2013 113 734 B4 and JP 4 325 470, for example, a method is known, in which hot isostatic pressing is used to bond a metal sheet to a ceramic layer to form a metal-ceramic substrate. Hot isostatic pressing is also used for post-treatment to reduce a number of voids formed during bonding using a soldering method or a direct metal bonding method.

SUMMARY

Starting from prior art, the object of the present invention is to provide a method for the production of metal-ceramic substrates that is further improved compared to the methods known from prior art, in particular with regard to bonding the metal to the ceramic in a successful, preferably void-free, energy-saving and method-safe manner.

According to the present invention, this object will be achieved by providing a method for producing a metal-ceramic substrate as described herein and a metal-ceramic substrate as described herein. Other embodiments are to be found in the specification, independent claims, dependent claims and the description.

According to a first aspect of the present invention, a method of making a metal-ceramic substrate is provided comprising:
providing a ceramic member and a metal sheet,
providing a gas-tight container enclosing the ceramic member,
forming the metal-ceramic substrate by bonding the metal sheet to the ceramic member by hot isostatic pressing,
wherein, for forming the metal-ceramic substrate, an active metal sheet or a contact layer comprising an active metal is at least sectionally arranged between the metal sheet and the ceramic element to promote metal sheet bonding, in particular metal container bonding, to the ceramic element.

BRIEF DESCRIPTION OF THE DRAWINGS

Further advantages and features will be apparent from the following description of preferred embodiments of the object according to the invention while making reference to the accompanying figures. Individual features of the individual embodiment may be combined with each other within the scope of the invention, wherein.

DETAILED DESCRIPTION

Figure 1A:
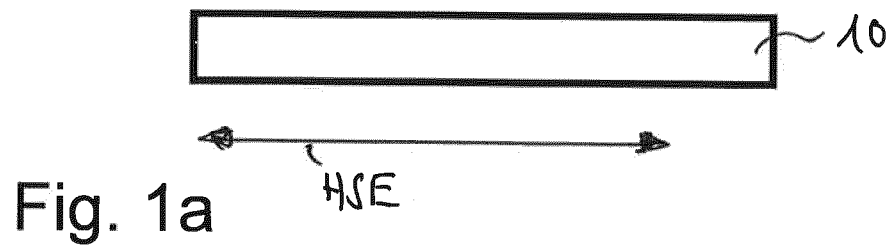
FIGS. 1a, 1b, 1c, 1d, 1e, 1f, and 1g: show a method for producing a metal-ceramic substrate according to a first example embodiment of the present invention.

In contrast to the methods known in prior art, hot isostatic pressing is used to bond a metal sheet or metal sheet to the ceramic element, with an active metal sheet being at least sectionally arranged between the metal sheet and the ceramic element to support the metal sheet bonding to the ceramic element. It has been found that using an active metal sheet increases probability of bonding as well as permanent bonding the metal sheet, which is part of the gas-tight metal container, for example, to the ceramic element in a successful and method-reliable manner. In this context, it is particularly intended for the bonded metal sheet or the metallization of the produced metal-ceramic substrate 1 to originally be part of the gas-tight container, or for a separate metal sheet 20 to be arranged in the container 25, preferably in a glass container, together with the ceramic element 10. See FIG. 1f. Subsequently, the metal sheet is bonded to the ceramic element in the hot isostatic pressing process, wherein the container is preferably formed as a metal container from a metal sheet and/or an additional metal sheet. Alternatively, it is also conceivable to use a glass container.

In hot isostatic pressing, it is in particular envisaged that heating, in particular sintering, will be performed in which the metal sheet and/or the additional metal sheet of the metal container, in particular the subsequent metal layer of the metal-ceramic substrate, will not be transferred to the melting phase of the metal sheet and/or the melting phase of the additional metal sheet. Similarly, for hot isostatic pressing lower temperatures are required than for a direct metal bonding method, in particular a DCB method. Compared to the bonding of a metal sheet to a ceramic layer using a solder material, in which temperatures below the melting temperature of the metal sheet are usually used, in the present method, a solder base material may advantageously be omitted, requiring an active metal only. Use or utilization of pressure during hot isostatic pressing also proves to be advantageous because, as a result, air inclusions between the metal sheet and/or the additional metal sheet on the one hand and the ceramic element on the other hand may be reduced, thereby reducing frequency of cavity formation, or even avoiding cavity formation in the metal-ceramic substrate formed or produced. This has an advantageous effect on the quality of the bond between the metal layer and/or the metal sheet and/or the additional metal sheet of the metal container and the ceramic element. In particular, a "solid-state diffusion bonding" (SDB) method will be realized in this way.

In particular, the person skilled in the art understands as a contact layer comprising an active metal a layer in which the amount of active metal is greater than 15% by weight, preferably greater than 25% by weight and particularly preferably greater than 50% by weight. Thus, the person skilled in the art considers the contact layer comprising an active metal not as an active solder material, which, to a small extent, may also contain active metal.

It is also conceivable that several active metal layers are used, which are arranged above each other. It is also conceivable that active metal and/or a contact layer containing active metal is applied to the metal sheet and the ceramic element respectively. Preferably, both an active metal layer and an active metal-containing contact layer are arranged between the metal sheet and the ceramic element. Preferably, the active metal layer is arranged on the ceramic element and is covered by the contact layer in the assembled state.

In addition, narrower isolation trenches can be realized, for example in a dimension corresponding to that width of isolation trenches that can be achieved in substrates produced by means of DCB methods. In particular, isolation trenches can be reduced in size by about 200 μm, since solder residues, which generally project up to about 200 μm into the isolation trenches when active soldering methods are used, are not to be expected. The solder residue is measured starting from the end of the etching flank in the direction of the isolation trench. The solder residues are measured in the overall metal portions which are opposite to each other and delimiting an isolation trench in a direction parallel to the main extension plane.

Preferably, the metal-ceramic substrate is provided as a printed circuit board in which, in the manufactured state, the metal layer or metallization bonded to the ceramic element is structured. For example, it is provided for this purpose that, in addition to hot isostatic pressing, structuring, for example by laser structuring, etching and/or mechanical processing, is also performed to form the metal-ceramic substrate, used to realize conductor tracks and/or connections for electrical or electronic components. Preferably, a backside metallization and/or a cooling element is provided to be applied on the produced metal-ceramic substrate on the ceramic element, on the side opposite the metal layer. Preferably, the backside metallization is to counteract deflection, and the cooling element is to effectively dissipate heat that arises during operation from electrical or electronic components that are connected to the printed circuit board or the metal-ceramic substrate.

Preferably, only one active metal layer or only one active metal is provided between the metal container and the ceramic element.

In particular, bonding is performed without a solder base material or is performed without the use of a solder base material.

Examples of an active metal are titanium (Ti), zirconium (Zr), hafnium (Hf), chromium (Cr), niobium (Nb), cerium (Ce), tantalum (Ta), magnesium (Mg), lanthanum (La) and vanadium (V). It should be noted here that the metals La, Ce, Ca and Mg can oxidize easily. It is further noted that the elements Cr, Mo and W are not conventional active metals, but are suitable as contact layers between $Si_3N_4$ and the at least one metal layer or the solder system or solder material, since they do not form intermetallic phases with the at least one metal layer, for example copper, and do not have edge solubility. In particular, the solder base material which may be omitted in the method is a metal-based base material, preferably a silver-based base material or a copper-based base material. In a silver-based base material, silver is the main component, i.e., the component with the highest content in terms of weight percentage, while in a copper-based base material, copper is the main component. Examples of a silver-based base material are AgCu, in particular AgCu28, AgCuIn, AgCuSn and AgCuGa. Examples of a copper-based base material are copper CuSn, CuAg, CuIn, CuGa, CuInSn, CuInMb and CuGaSn. It is also conceivable to dispense with a solder base material based on NiCrMn or SnCu.

Furthermore, a contact layer comprising an active metal is to be understood as a layer which, for example, comprises a compound containing an active metal, such as TiN, TiC or TiO, in particular in different oxidation states or in different stoichiometric and non-stoichiometric compounds. It is also conceivable that it is an alloy comprising one or more active metals.

As an alternative to bonding without solder base material, it is also conceivable that a solder base material or a solder material comprising an active metal is arranged between the active metal layer or the contact layer and the metal container. This creates additional bonding. In this case, it is conceivable that bonding is performed at a temperature below or above the method temperature of the solder material or the solder base material. Furthermore, it is advantageous in this case to use a silver-free solder material or solder base material.

Materials suitable for the at least one metal layer and/or the at least one additional metal layer in the metal-ceramic substrate or insulation element are copper, aluminum, molybdenum, tungsten and/or alloys thereof, such as CuZr, AlSi or AlMgSi, and laminates such as CuW, CuMo, CuAl and/or AlCu or MMC (metal matrix composite), such as CuW, CuMo or AlSiC. Furthermore, it is preferred that the at least one metal layer on the manufactured metal-ceramic substrate is surface-modified, in particular as component metallization. As a surface modification, for example, sealing with a noble metal, in particular silver; and/or gold, or (electroless) nickel or ENIG ("electroless nickel immersion gold") or edge casting on the metallization to suppress crack formation or widening is suitable.

Preferably, the ceramic element comprises $Al_2O_3$, $Si_3N_4$, AlN, an HPSX ceramic (i.e., a ceramic with an $AL_2O_3$ matrix comprising an x-percent share of $ZrO_2$, for example $AL_2O_3$ with 9% $ZrO_2$=HPS9 or $AL_2O_3$ with 25% $ZrO_2$=HPS25), SiC, BeO, MgO, high-density MgO (>90% of the theoretical density), TSZ (tetragonally stabilized zirconium oxide) as a material for the ceramic material. To combine various desired properties, it is also conceivable in this context, that the ceramic element is designed as a composite or hybrid ceramic, in which several ceramic layers, each of which differs in terms of its material composition, are arranged on top of each other and joined together to form an insulating element.

Preferably, the active metal layer is applied to the ceramic element and/or an inner surface of the metal container by a physical and/or chemical vapor deposition, for example a sputtering method, and/or electrochemically or chemically. By using a vapor deposition method, for example a sputtering method, it is advantageously possible to provide comparatively thin active metal layers which, in particular with regard to their thickness, can be formed such that they have a beneficial effect on the bonding performance but, for example, do not impair further method steps such as the etching of a structure any further. The active metal layer can be applied to the metal sheet and/or the additional metal sheet prior or following formation of the metal container, so that the active metal layer is formed on the inside of the metal container provided.

In particular, it is provided that the active metal layer is applied to be structured and/or is structured. In this way, it may specifically be achieved that certain areas devoid of the active metal layer, in particular those areas which are to represent areas in the manufactured metal-ceramic substrate where no metal is provided or no bonding is locally desired. In these areas, for example, so-called iso-trenches are formed. The targeted omission or keeping free of active metal simplifies or eliminates the structuring method, in particular second etching, in the production method, since the active metal in the bonding area between the metal layer and the ceramic element does not have to be removed again at great expense. It is conceivable, for example, that in the course of vapor deposition, masking is used to ensure that certain areas on the top of the ceramic element and/or the inside of the metal container remain free of active metal. Alternatively, it is conceivable that parts of the applied active metal layer are removed again prior to the bonding method, for example by etching and/or by laser light. Since in this state, no bond has yet been realized between the ceramic element and the active metal, removal is comparatively easy in this stage.

It is useful that the active metal layer is subjected to an energy input prior to hot isostatic pressing. For example, it is conceivable that energy is added to the active metal layer using a flash of light, performed in "flashlight annealing". This further improves the bonding performance of the metal container via the active metal layer to the ceramic element, or a peak temperature can further be reduced during the HIP method, especially for lower-melting metals, such as aluminum and alloys thereof. Herein, the energy input preferably occurs following arranging the active metal layer on the insulation element or on the at least one metal layer.

Preferably, formation of the gas-tight metal container is to be performed in a vacuum or in a specified gas atmosphere, wherein in particular an interior of the metal container is vacuumed and/or flushed with nitrogen.

Furthermore, it is conceivable that a ratio of a first thickness of the active metal layer to a second thickness of the metal sheet and/or the additional metal sheet the metal container is formed or constructed has a value that is less than 0.003, preferably less than 0.0015, particularly preferably less than 0.001. Furthermore, it is preferably provided that the ratio of the first thickness to the second thickness has a value greater than 0.00015 preferably greater than 0.0002 and more preferably greater than 0.0003. For example, the ratio of the first thickness to the second thickness has a value between 0.00015 and 0.003, preferably between 0.0002 and 0.0015 and more preferably between 0.0003 and 0.001. The present values apply in particular to second thicknesses between 300 μm and 1000 μm. As a result, a thin active metal layer is provided in comparison with the metal sheet and/or additional metal sheet, which again may be removed comparatively easily using an etching process, in particular following the production method or following bonding the metal sheet and/or the additional metal sheet to the ceramic element.

In particular for second thicknesses greater than 1 mm, it is provided that the ratio of the first thickness of the active metal layer to the second thickness of the metal sheet and/or the additional metal layer wherefrom the metal container is made or is formed has a value which is less than 0.0006, preferably less than 0.0004, particularly preferably less than 0.0003. Furthermore, it is preferably provided that the ratio of the first thickness to the second thickness has a value greater than 0.00005 preferably greater than 0.00008 and more preferably greater than 0.0001. For example, the ratio of the first thickness to the second thickness has a value between 0.00005 and 0.0006, preferably between 0.00008 and 0.0004 and more preferably between 0.0001 and 0.0003.

Preferably, it is provided that in hot isostatic pressing the metal container is subjected in a heating and pressure device to a gas pressure of between 100 and 2000 bar, preferably 150 bar and 1200 bar and particularly preferably 300 and 1000 bar and a process temperature of 300° C. up to a melting temperature, in particular up to a temperature below the melting temperature of the metal sheet and/or the additional metal sheet. Advantageously, it has been found that it is thus possible to bond a metal layer, i.e., a metal sheet and/or an additional metal sheet of the metal container, to the ceramic element without reaching the required temperatures of a direct metal bonding method, for example a DCB or a DAB method, and/or without a solder base material used in active soldering. In addition, use of an appropriate gas pressure allows a metal-ceramic substrate to be produced with as few voids as possible, i.e., without gas inclusions between the metal layer and the ceramic element. In particular, method parameters are used which are mentioned in DE 10 2013 113 734 A1 and which herein explicitly is referred to.

Furthermore, it is preferably provided that a metal sheet and an additional metal sheet are provided for forming a metal container, which are dimensioned such that a portion of the metal sheet and the additional metal sheet each protrude with respect to an outermost edge of the ceramic element, the protruding portions being joined to form the metal container, preferably following deformation of the protruding portion with a clamping force. It has been found that a gas-tight metal container can be produced in this way, the projecting portions of the metal sheet and of the additional metal sheet, after joining, forming a joined region which surrounds the ceramic element in a circumferential or frame-like manner in a plane running parallel to the main extension plane. In particular, it is provided that, in order to form the metal container, the free edge portions of the metal sheet and the additional metal sheet are deformed by applying a clamping force before they are directly joined and then the free edge portions of the metal sheet are joined to one another at the edges by welding, in particular contact welding or laser welding, or by soldering, including hard soldering. Alternatively or additionally, the edge-side direct connection of the metal sheet and additional metal sheet can be produced using mechanical bonding or a machining method, such as rolling, pressing and/or beading of the free edge portions. For the form of the metal container, the application expressly refers to the contents of the disclosure of application DE 10 2013 113 734 A1.

Furthermore, it is preferred that the active metal layer is provided as a foil. For example, it is conceivable that the active metal layer is provided together with the metal sheet and/or the additional metal sheet from which the metal container is formed. For example, both the metal sheet and/or the further metal sheet and the active metal layer are provided together and are preferably rolled out to a preferred thickness by means of rolls. Alternatively, it is conceivable that the active metal layer is separately arranged as a single foil on the ceramic element or between the ceramic element and the metal container. The use of a single foil proves to be advantageous in particular because a thickness of the active metal layer can be provided which is as homogeneous and uniform as possible. In addition, comparatively thin active metal layers can be realized in this way. Furthermore, it is conceivable that the active metal layer is applied to the at least one metal layer.

Preferably, the metal sheet is provided to be part of the container or to at least partially form the container. In this case, the metal sheet and/or the further metal sheet becomes part of the subsequent metal-ceramic substrate. Preferably, the gas-tight container, in particular the glass container, rests with its inner side against the metal sheet and/or further metal sheet during hot isostatic pressing in order to press the metal sheet and/or further metal sheet uniformly against the ceramic element, the effect of the pressing being transferred from the container to the ensemble. For this purpose, a corresponding pressure is applied outside the container causing the pressing-on action onto the ensemble.

Another object of the present invention is a metal-ceramic substrate produced by the method according to the invention. All the properties and advantages described for the method can analogously applied to the metal-ceramic substrate and vice versa.

In particular, the proposed method provides a metal-ceramic substrate in which, due to the existing pressure conditions, virtually no voids occur or the number of voids is reduced compared with metal-ceramic substrates produced by an AMB or DCB method. In addition, a constant metal layer thickness is formed in the profile, which corresponds to the profile of the ceramic surface. Furthermore, the method allows silver-containing solder base materials to be eliminated, which simplifies second etching. As a result, narrower isolation trenches can be realized, for example in a dimension corresponding to the width of isolation trenches that can be achieved with substrates manufactured by DCB methods. In particular, isolation trenches can be reduced in size by about 200 µm, since solder residues, which usually project up to 100 µm per side into the isolation trenches, are not to be expected. This solder residue is measured starting from the end of the etch flank in the direction of the isolation trench. The solder residues are measured as the total of opposing metal portions that limit an isolation trench in a direction parallel to the main extension plane. In addition, fringe formation at the boundary between the metal layer and the ceramic element can be reduced, since the silver components in the solder material otherwise lead to etching that is difficult to control, which is evidently manifested in fringe-like progressions in a direction parallel to the main extension plane. Furthermore, constant thickness of the metal layer, which does not change over the entire metal-ceramic substrate, allows the etching method to be performed in identical manner for all areas of the metal-ceramic substrate without the need to implement modulations of the metal layer thickness. The constant thickness is achieved because the pressure used in hot isostatic pressing presses the metal sheet or metal layer homogeneously against the profile of the ceramic element. In addition, achieving a uniform etching flank geometry across the metal-ceramic substrate is advantageously possible due to homogeneous material distribution in the metal layer.

In particular, the at least one metal layer and the insulating element is to be extended along a main extension plane and arranged above each other along a stacking direction extending perpendicularly to the main extension plane, a bonding layer being formed in the produced carrier substrate between the at least one metal layer and the insulating element, an adhesion-promoting layer of the bonding layer having a sheet resistance which is greater than 5 ohm/sq, preferably greater than 10 ohm/sq and particularly preferably greater than 20 ohm/sq.

Compared to the carrier substrates known from prior art, according to the invention, the sheet resistance of an adhesion promoter layer of the bonding layer is greater than 5 ohm/sq, preferably greater than 10 ohm/sq and particularly preferably greater than 20 ohm/sq. The sheet resistance determined is directly related to a proportion of the active metal in the bonding layer, which is essential for bonding the at least one metal layer to the insulating element. The sheet resistance increases as the proportion of active metal in the bonding layer decreases. A correspondingly high sheet resistance thus corresponds to a low active metal content in the bonding layer. It has been found that with increasing active metal content, the formation of brittle intermetallic phases is favored, which in turn is detrimental to the peel strength of the metallic layer from the insulating layer. In other words, the sheet resistivities required according to the invention provide bonding layers, the peel strength of which is improved, i.e., is increased, due to reduced formation of brittle intermetallic phases. Particularly strong bonds between the at least one metal layer and the ceramic element may thus be achieved by selectively adjusting the sheet resistivities in accordance with the requirements.

To determine the sheet resistance, the metal layer and possibly a solder base layer are first removed from the manufactured substrate, for example by etching. A sheet resistance is then measured using a four-point measurement on the upper or lower side of the carrier substrate wherefrom the at least one metal layer and the solder base layer have been removed. In particular, the surface resistance of a material sample is to be understood as resistance thereof in relation to a square surface area. It is common practice to assign the unit of Ohm/sq to the surface resistivity. The physical unit of the surface resistance is ohm.

Preferably, a thickness of the bonding layer, measured in the stacking direction and averaged over a plurality of measuring points within a predetermined area or in a plurality of areas which runs or run parallel to the main extension plane, has a value, which is less than 20 µm, preferably less than 10 µm and particularly preferably less than 6 µm. Making reference to a plurality of areas particularly means that the at least one metal layer is subdivided into areas of the same size as far as possible and in each of these areas, subdividing the at least one metal layer, at least one value, preferably a plurality of measured values for the thickness are detected. The thicknesses determined in this way at different points are arithmetically averaged.

Compared with the carrier substrates known from prior art, a comparatively thin bonding layer is thus formed between the at least one metal layer and the insulation element. To determine the relevant thicknesses of the bonding layer, the measured thicknesses are averaged over a large number of measuring points which are located within a predetermined or defined surface. This advantageously takes into account the fact that the insulation element, in particular the ceramic element, is generally subject to undulation, i.e., the insulation element is said to have a waviness. In particular, the person skilled in the art understands a waviness to be a modulation of the general flat course of the insulation element, seen over several millimeters or centimeters along a direction that extends parallel to the main extension plane. This distinguishes such an undulation from a surface roughness of the insulating element, which is usually present in addition on the insulating element. By including such generally unavoidable undulation of the insulation element into thickness determination, the bonding layer may possibly vary due to the undulation; in particular, it may be larger in valley regions of the insulation element than in peak regions of the insulation element.

Regardless of this undulation, the averaged thickness value is nevertheless significantly lower than that known in prior art carrier substrates. This will in particular or for example be achieved by arranging a required active metal layer between the insulation element and the at least one metal layer, which in particular is arranged individually, i.e., separately, for example in addition to a solder base material. Preferably, the active metal is applied to the solder base material and/or the at least one metal layer and/or the insulating element using chemical and/or physical vapor deposition, for example sputtering, to realize comparatively thin active metal layers, which in turn lead to a comparatively thin bonding layer, in particular a homogeneous and thin adhesion-promoting layer. It is also conceivable to provide the active metal layer on the solder base material, the insulation element and/or the at least one metal layer using a plasma, in a vacuum and/or by means of vapor deposition. It is also conceivable to realize the active metal layer by electroplating. It is particularly preferred that the active metal layer is provided as a foil.

Formation of comparatively thin bonding layers in particular reduces the effort required to remove the bonding layer for example in a "second etching" method, at least in certain areas, to structure the carrier substrate, in particular to structure the at least one metal layer thereof and the bonding layer. Preferably, this structuring, which is to electrically isolate a plurality of metallic portions of the at least one metallic layer from each other, is performed by an etching and/or a mechanical processing step and/or using laser light. Furthermore, it has been shown to be advantageous that use of small layer thicknesses can advantageously reduce the number of potential defects in the bonding layer, for example caused by material defects in the solder material. A defect in the bonding layer or a material defect in the solder material is understood to be, for example, a large grain in the solder material, such as an active metal grain, which may cause giant grain formation in the bonding layer, and/or the large grain does not melt completely, thus preventing minimal solder gaps as spacers. Application, in particular using sputtering, is a simple way of preventing comparatively large grains from becoming part of the active metal layer and in particular of the subsequent bonding layer. Finally, it is advantageous that a thin bonding layer is homogeneously formed over the produced carrier substrate.

Particularly preferably, the following method is provided for determining and selecting the measuring ranges contributing to the determination independently of the size of the carrier substrate:

In a first step, the at least one metal layer of the carrier substrate is divided into nine rectangles of equal size, in particular squares, i.e., into several areas. Two or three cut-away views are generated in the respective measurement areas defined in this way, which cut-away views are used to determine an averaged thickness for the at least one metal layer in each one of the cut-away views. The cut-away views are preferably recorded using a SEM method, for example at a magnification of 2000 or 2500 times. Subsequently, in a second step, an average is taken over the total of 18 or 27 averaged thicknesses recorded in the cut-away views, which thicknesses are distributed over all nine rectangular measurement areas. In this way, it is advantageously ensured that the averaged thickness is a representative value for the bonding layer between the at least one metal layer and the insulation element. In other words, the procedure described herein provides averaged thicknesses determined over the at least one metal layer as viewed in uniformly distributed measurement regions. The procedure described herein for selecting the measurement ranges contributing to the determination of an averaged value for the thickness is analogously to be used for the determination of the surface resistivity.

Preferably, the bonding layer and/or the additional bonding layer is an active metal-comprising adhesion-promoting layer. In particular, the bonding layer is to be formed only from the adhesion-promoting layer comprising the active metal. In this regard, the adhesion-promoting layer in the bonding layer has a bond with a constituent of the ceramic element, such as nitrogen, oxygen, or carbon, and the other constituents of the ceramic.

Similarly, the adhesion promoter layer comprises, for example, titanium nitride, titanium oxide, and/or titanium carbide. In this case, a thickness of the bonding layer measured in the stacking direction averaged over a plurality of measurement points within a surface parallel to the main extension plane, or the plurality of surfaces, is to assume a value smaller than 0.003 mm, preferably smaller than 0.001 mm, and particularly preferably smaller than 0.0005 or even smaller than 0.00035 mm. In particular for such bonding layers, where a solder base material and/or a silver portion is eliminated, an even thinner bonding layer can similarly be formed.

Further advantages and properties will arise from the following description of preferred embodiments of the invention while reference will be made to the accompanying figures, wherein in the FIGS. 1a to 1e a method for producing a metal-ceramic substrate 1 according to a first example embodiment of the present invention is shown. Such metal-ceramic substrates 1 preferably serve as a carrier or printed circuit board for electronic or electrical components which are connectable to a metal layer 20 of the metal-ceramic substrate 1. In this context, it is preferred that the metal layer 20 is structured to form appropriate conductor tracks and/or connection areas. The metal layer 20 substantially extending along a main extension plane HSE and the ceramic element 10 will thus be arranged on top of each other along a stacking direction S extending perpendicularly to the main extension plane HSE and will preferably be joined or connected to each other. In addition to the metal layer 20, the metal-ceramic substrate 1 preferably comprises a backside metallization 20' which, as viewed in the stacking direction S, is arranged and bonded to the side of the ceramic element 10 opposite the metal layer 20. The backside metallization 20' and/or an additional cooling element, for example, in particular are to counteract deflection of the metal-ceramic substrate 1 and/or to dissipate heat input caused by electrical or electronic components on the metal-ceramic substrate 1.

Figure 1B:
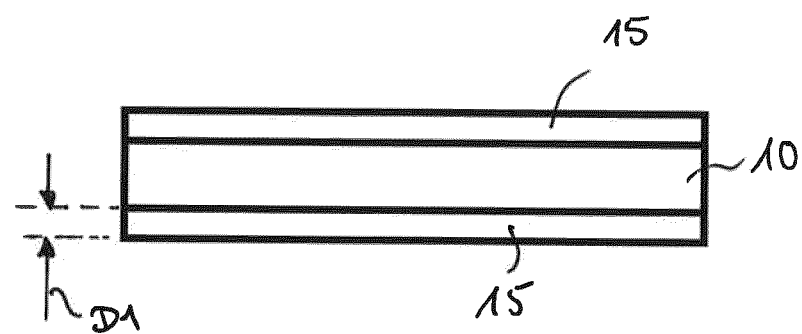
Figure 1C:
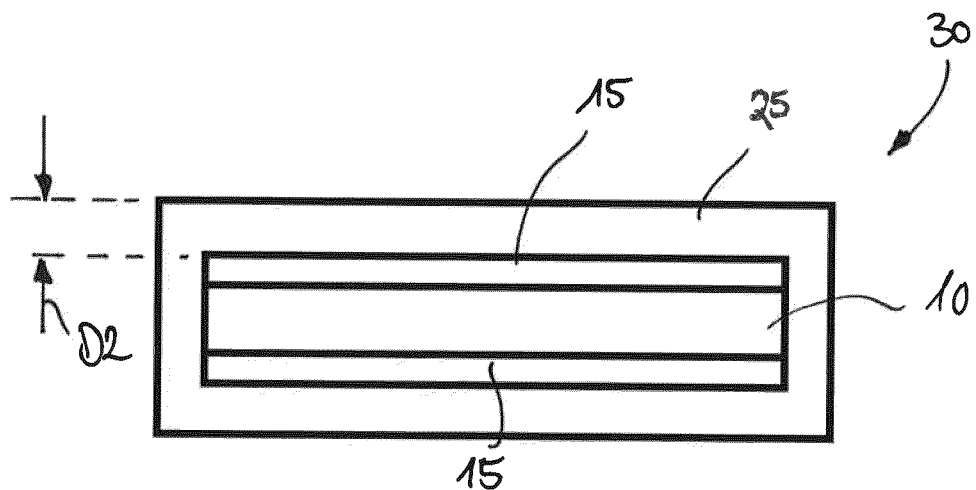

The method described in FIGS. 1a to 1e is in particular used to bond the metal layer 20 and/or the backside metallization 20' to the ceramic element 10. For this purpose, a ceramic element 10 is first provided (see FIG. 1a). In FIGS. 1b and 1c, an ensemble 30 is formed, the ensemble 30 comprising an active metal layer 15 and a metal container 25 in addition to the ceramic element 10. In the embodiment as illustrated, the active metal layer 15 is first arranged on the ceramic element 10, preferably on both sides. This can be done, for example, by using a physical and/or chemical vapor deposition method and/or electrochemically. Alternatively, the active metal layer 15 could also be formed on an inner side of the metal container 25, the inside of the metal container 25 facing the ceramic element 10 in the ensemble 30.

In the ensemble 30 shown in FIG. 1c, the metal container 25 completely encloses the ceramic element 10 and the active metal layer 15. Herein, enclosing is meant to refer to the portions of the active metal layer 15 that is disposed within the metal container 25 (for example, the active metal layer 15 could extend over the edge of the metal container 25). Thereby, the active metal layer 15 is arranged between an inner side of the metal container 25 and the ceramic element 10, as viewed in the stacking direction S. In particular, the metal container 25 is a gas-tight metal container 25, which especially rests against the active metal layer 15 and/or the ceramic element 10 over its entire inner surface.

For example, a metal container 25 of this type can be produced using a metal sheet and an additional metal sheet by arranging between the metal sheet and the additional metal sheet a sub-ensemble having a ceramic element 10 and preferable the active metal layers 15, being arranged at the ceramic element at both sides. In this case, the metal sheet and the additional metal sheet are preferably dimensioned such that they project in the direction of the main extension plane HSE with respect to an outermost edge of the ceramic element 10 and/or of the active metal layer 15. Alternatively, it is also conceivable that the metal container 25 is formed by bonding the metal sheet and/or the additional metal sheet to the ceramic element 10, for example by hard soldering. In this case, the metal sheet 45 and/or the additional metal sheet 55 are not required to protrude with respect to the ceramic element 10. The respective protruding portions 45a, 55a of the metal sheet 45 and additional metal sheet 55 may be then bonded together (see FIG. 1g), preferably along a perimeter of the sub-ensemble of ceramic element 10 and active metal layer 15 to form a gas-tight metal container 25. Preferably, formation of the metal container 25 is performed under vacuum. It is also conceivable that a bag is formed from the metal sheet, in which the ceramic element 10 and the active metal layer 15 are arranged. Subsequently, the bag is gas-tightly sealed.

Furthermore, it is preferably provided that the active metal layer 15 has a first thickness D1 in a direction running parallel to the stacking direction S and the metal sheet and/or additional metal sheet from which the metal container 25 is formed has a second thickness D2 dimensioned in the same direction, in particular in the region of an upper and/or lower side of the sub-ensemble resulting in a ratio of the first thickness D1 to the second thickness D2 smaller than 0.0006, preferably smaller than 0.0004, particularly preferably smaller than 0.0003. In other words, the active metal layer 15 is comparatively thin compared to the second thickness D2 of the metal sheet and/or the additional metal sheet used to form the metal container 25.

Figure 1D:
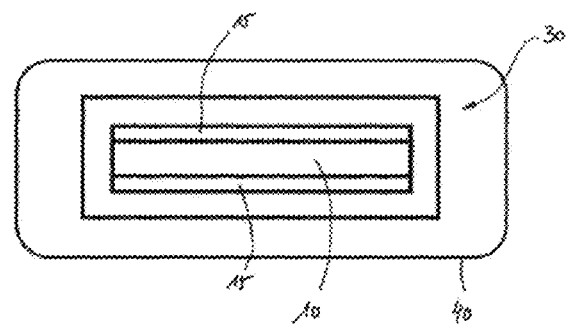
Figure 1E:
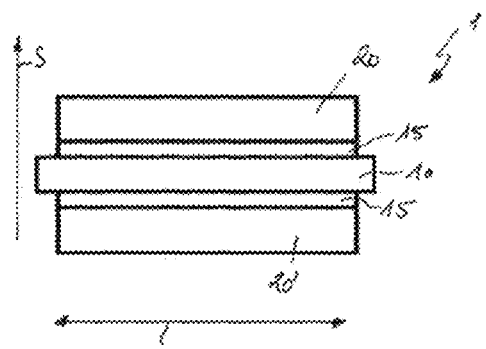
Figure 1F:
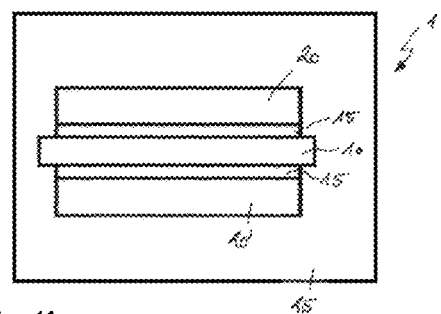
Figure 1G:
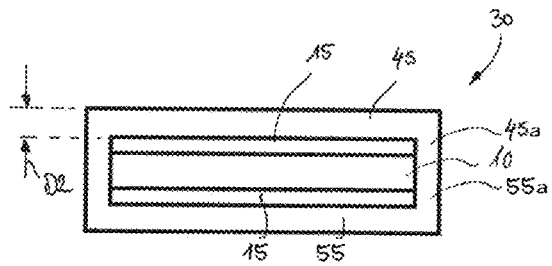

Furthermore, the ensemble 30, which comprises the metal container 25, the ceramic element 10 and the active metal layer 15 arranged between the metal container 25 and the ceramic element 10 as seen in stacking direction S, is fed to a heating and pressure device 40 (FIG. 1d). In the heating and pressure device 40, the at least portion-wise bonding of the metal container 25 to the ceramic element 10 is performed using hot isostatic pressing by subjecting the ensemble 30 to a gas pressure between 100 bar and 2000 bar, preferably 150 bar and 1200 bar and particularly preferably 300 and 1000 bar, and to a method temperature between 300° C. and a temperature below a melting temperature of the metal sheet, or to a melting temperature, respectively. In particular, hot isostatic pressing involves sintering, i.e., heating, without generating a melt, which is typically used to bond a metal layer to the ceramic element in a DCB process. This allows creating a bond between the metal sheet of the metal container 25 and the ceramic element 10 without requiring application of the more required temperatures of a DCB method. At the same time, the gas pressure during hot isostatic pressing reduces the number, or frequencies of voids, i.e., gas inclusions between the metal sheet and/or the additional metal sheet and the ceramic element 10. As a result, an improved bond and a higher quality bond between the ceramic element 10 and the metal layer 20 is created.

In this regard, it has been found that use of an active metal layer 15 has a positive effect on the bonding method and the bonding of the metal sheet and/or the additional metal sheet of the metal container 25 to the ceramic element 10. In particular, hot isostatic pressing using an active metal layer 15 differs from a brazing process in that the brazing process typically requires a brazing base material in addition to the active metal to ensure bonding between the metal layer 20 and the ceramic element 10. Following bonding of the metal sheet 20 or the additional metal sheet, respectively of the metal container to the ceramic element 10, the ensemble 30 will be freed of parts or portions, respectively, especially by removing portions of the metal sheet or the additional metal sheet, respectively, forming the metal container 25.

Preferably, structuring the metal sheet and/or additional metal sheet, or of the metal layer 20, which was bonded to the ceramic element 10 in the course of the hot isostatic pressing, will simultaneously be performed. In particular, the portions protruding in the direction of the main extension plane HSE to form the metal layer 25 opposite the ceramic element 10 and/or the active metal layer 15 and bonded to each other to form the gas-tight metal layer 25 are removed (see FIG. 1c). In other words, preferably a portion of the metal container 25 surrounding and framing the ceramic element 10 is removed.

Furthermore, the metal sheet and/or additional metal sheet or the metal layer 20, i.e., the metallization, of the produced metal substrate 1 is structured or becomes structured such that the ceramic element 10 protrudes with respect to the outermost edge of the metal layer 20 in a direction parallel to the main extension plane HSE. In this way, a so-called pullback is created which contributes to electrical insulation between metal layer 20 and backside metallization 20' and prevents flashovers.

LIST OF REFERENCE NUMBERS

1 Metal ceramic substrate
10 Ceramic element

15 Active metal layer
20 Metal layer
20' Backside metallization
25 Metal container
30 ensemble
40 Heating and pressure device
S stacking direction
D1 first thickness
D2 second thickness
HSE main extension plane

The invention claimed is:

1. A method for producing a metal-ceramic substrate (1) comprising:
providing a ceramic element (10) and a metal sheet,
providing a gas-tight container (25) enclosing the ceramic element (10),
forming the metal-ceramic substrate (1) by bonding the metal sheet to the ceramic element (10) using hot isostatic pressing, wherein, for forming the metal-ceramic substrate (1), an active metal layer (15) is at least sectionally arranged between the metal sheet and the ceramic element (10) to promote metal sheet bonding to the ceramic element (10),
wherein the active metal is titanium, zirconium, hafnium, chromium, niobium, cerium, tantalum, magnesium, lanthanum, vanadium, molybdenum, or tungsten, and
wherein the metal sheet is structured to form a metal-ceramic substrate suitable as a printed circuit board, characterized in that the active metal layer (15) comprises only one active metal layer between the container and the ceramic element, and bonding is performed without the use of a solder material.

2. The method according to claim 1, wherein the active metal layer (15) is applied by vapor deposition and/or is electrochemically or chemically applied to the ceramic element (10) and/or to a side of the metal sheet.

3. The method according to claim 1, wherein the active metal layer (15) is applied in a structured manner and/or is structured.

4. The method according to claim 1, wherein the active metal layer (15) is subjected to an energy input prior to hot isostatic pressing.

5. The method according to claim 1, wherein formation of the gas-tight container (25) is performed in a vacuum or in a defined gas atmosphere.

6. The method according to claim 1, wherein a ratio of a first thickness (D1) of the active metal layer (15) to a second thickness (D2) of the metal sheet and/or an additional metal sheet, from which the gas-tight container (25) is formed, has a value that is smaller than 0.003.

7. The method according to claim 1, wherein during hot isostatic pressing the gas-tight container (25), in a heating and pressure device (40), is subjected to a gas pressure between 100 and 2000 bar, and to a process temperature between 300° C. up to the melting temperature of the metal layer.

8. The method according to claim 1, wherein the metal sheet and an additional metal sheet are provided for forming a gas-tight metal container (25), which metal sheet and additional metal sheet are dimensioned such that a portion of each of the metal sheet and the additional metal sheet protrudes from an outermost edge of the ceramic element (10), the protruding portions being joined to form the metal container (25).

9. The method according to claim 1, wherein the metal sheet is arranged as a separate component in the gas-tight container (25).

10. The method according to claim 1, wherein the active metal layer (15) comprises greater than 25 wt. % of the active metal, based on a total weight of the active metal layer (15).

11. The method according to claim 1, wherein, for forming the metal-ceramic substrate (1), the active metal layer (15) comprising the active metal is at least sectionally arranged between the metal sheet and the ceramic element (10) to promote metal sheet bonding to the ceramic element (10).

12. The method for producing a metal-ceramic substrate (1) of claim 1,
wherein the gas-tight container (25) is formed from or comprising the metal sheet,
wherein the active metal layer (15) is applied by vapor deposition and/or is electrochemically or chemically applied to the ceramic element (10) and/or to a side of the metal sheet and/or to an inner side of the gas-tight container (25).

13. The method according to claim 12, wherein the active metal layer (15) is subjected to an energy input prior to hot isostatic pressing.

14. The method according to claim 12, wherein during hot isostatic pressing the gas-tight container (25), in a heating and pressure device (40), is subjected to a gas pressure between 100 and 2000 bar, and to a process temperature between 300° C. up to the melting temperature.

15. The method according to claim 12, wherein a ratio of a first thickness (D1) of the active metal layer (15) to a second thickness (D2) of the metal sheet and/or an additional metal sheet, from which the gas-tight container (25) is formed, has a value that is smaller than 0.0015.

16. The method according to claim 12, wherein the metal sheet and an additional metal sheet are provided for forming a metal container (25), which metal sheet and additional metal sheet are dimensioned such that a portion of each of the metal sheet and the additional metal sheet protrudes from an outermost edge of the ceramic element (10), the protruding portions being joined to form the metal container (25).

17. The method according to claim 12, wherein, for forming the metal-ceramic substrate (1), an active metal layer (15) comprising an active metal are at least sectionally arranged between the metal sheet and the ceramic element (10) to promote metal sheet bonding to the ceramic element (10).

* * * * *